(12) United States Patent
Hwang et al.

(10) Patent No.: US 12,500,108 B2
(45) Date of Patent: Dec. 16, 2025

(54) BONDING SYSTEM AND METHOD

(71) Applicant: Taiwan Semiconductor Manufacturing Company, Ltd., Hsinchu (TW)

(72) Inventors: Chien-Ling Hwang, Hsinchu (TW); Chung-Jung Wu, Hsinchu (TW); Tung Li Wu, Hsinchu (TW); Wei-Chih Chen, Hsinchu County (TW); Hsu-Chin Tseng, Taoyuan (TW); Jeng-Nan Hung, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 153 days.

(21) Appl. No.: 18/446,431

(22) Filed: Aug. 8, 2023

(65) Prior Publication Data
US 2025/0054798 A1 Feb. 13, 2025

(51) Int. Cl.
*H01L 21/68* (2006.01)
*H01L 21/683* (2006.01)
(Continued)

(52) U.S. Cl.
CPC ........ *H01L 21/681* (2013.01); *H01L 21/6833* (2013.01); *H01L 21/68742* (2013.01); *H01L 23/544* (2013.01); *H05B 3/143* (2013.01); H01L 2223/54426 (2013.01); H05B 2203/002 (2013.01)

(58) Field of Classification Search
CPC .......... H05B 3/143; H05B 3/141; H05B 3/14; H05B 3/12; H05B 3/10; H01L 23/544; H01L 2223/54426; H01L 21/68771; H01L 21/68742; H01L 21/68714; H01L 21/687; H01L 21/6833; H01L 21/6831; H01L 21/683; H01L 21/682; H01L 21/681; H01L 21/68
See application file for complete search history.

(56) References Cited

U.S. PATENT DOCUMENTS 5,094,536 A * 3/1992 MacDonald ............ G03F 7/703
250/491.1
6,556,281 B1 * 4/2003 Govil .................. G03F 7/70216
430/311
(Continued)

*Primary Examiner* — Georgia Y Epps
(74) *Attorney, Agent, or Firm* — JCIPRNET

(57) ABSTRACT

Disclosed are a bonding system and a bonding method. In one embodiment, the bonding system includes a chamber, first and second electrostatic chucks, a visible light sensor module and a nonvisible light module. The chamber is configured to provide a vacuum state. The first electrostatic chuck is configured to hold a first substrate having a first alignment mark in the chamber, wherein the first electrostatic chuck has a first window. The second electrostatic chuck is configured to hold a second substrate having a second alignment mark in the chamber, wherein the second electrostatic chuck has a second window. The visible light sensor module is configured to capture images of the first and the second alignment marks. The nonvisible light module is configured to capture a combined image of the first and second alignment marks via the first and second windows overlapping each other in the vacuum state.

20 Claims, 14 Drawing Sheets

(51) Int. Cl.
*H01L 21/687* (2006.01)
*H01L 23/544* (2006.01)
*H05B 3/14* (2006.01)

(56) References Cited

U.S. PATENT DOCUMENTS

| | | | | |
|---|---|---|---|---|
| 7,896,046 B2* | 3/2011 | Park | ............... | B30B 1/34 |
| | | | | 156/360 |
| 9,741,591 B2* | 8/2017 | Schweikert | ............ | H10F 30/10 |
| 10,037,968 B2* | 7/2018 | Huang | ............. | H01L 21/67092 |
| 10,410,892 B2* | 9/2019 | Lu | ............... | H01L 24/80 |
| 10,453,692 B2* | 10/2019 | deVilliers | ............ | G06F 30/398 |
| 10,784,166 B2* | 9/2020 | Piao | ................ | H01L 21/78 |
| 10,943,807 B2* | 3/2021 | Wagenleitner | ........ | H01L 23/544 |
| 11,094,667 B2* | 8/2021 | Nakamitsu | ............ | H01L 24/74 |
| 11,189,515 B2* | 11/2021 | Wang | ................ | G01B 11/14 |
| 11,742,224 B2* | 8/2023 | Choi | ................ | H01L 21/68735 |
| | | | | 156/349 |
| 11,756,921 B2* | 9/2023 | Chang | .............. | H01L 21/68 |
| | | | | 438/16 |
| 12,027,401 B2* | 7/2024 | Jo | .................. | H01L 21/67259 |
| 12,094,747 B2* | 9/2024 | Yamauchi | ........... | H01L 21/6875 |
| 12,198,963 B2* | 1/2025 | Otsuka | ............. | H01L 21/6838 |
| 2002/0041368 A1* | 4/2002 | Ota | ................. | G03F 7/70258 |
| | | | | 250/548 |
| 2004/0036850 A1* | 2/2004 | Tsukamoto | ......... | G03F 7/707 |
| | | | | 355/75 |
| 2005/0161837 A1* | 7/2005 | Matsui | .............. | H01L 25/50 |
| | | | | 257/E21.705 |
| 2008/0047651 A1* | 2/2008 | Park | ................. | H01J 9/241 |
| | | | | 156/60 |
| 2008/0157407 A1* | 7/2008 | Chen | ................ | H01L 21/681 |
| | | | | 257/E23.179 |
| 2008/0245843 A1* | 10/2008 | Suga | ................ | H01L 24/75 |
| | | | | 228/116 |
| 2009/0322187 A1* | 12/2009 | Bibl | ................. | B41J 2/1631 |
| | | | | 310/366 |
| 2011/0134235 A1* | 6/2011 | Tsumura | ............ | H01L 23/544 |
| | | | | 348/87 |
| 2014/0186999 A1* | 7/2014 | Schweikert | ........ | H01L 21/67748 |
| | | | | 438/106 |
| 2015/0017782 A1* | 1/2015 | Akiyama | ........... | H01L 21/67092 |
| | | | | 438/455 |
| 2017/0221856 A1* | 8/2017 | Yamauchi | ........... | H01L 24/94 |
| 2017/0243853 A1* | 8/2017 | Huang | ............... | H01L 21/681 |
| 2018/0047699 A1* | 2/2018 | Omori | ............... | H01L 21/2007 |
| 2018/0144999 A1* | 5/2018 | Lu | ................... | H01L 24/94 |
| 2019/0312006 A1* | 10/2019 | Nakamitsu | ......... | H01L 21/68 |
| 2019/0355699 A1* | 11/2019 | Guo | ................. | H01L 21/681 |
| 2020/0227299 A1* | 7/2020 | Wagenleitner | ...... | H01L 23/544 |
| 2021/0183667 A1* | 6/2021 | Choi | ................ | H01L 21/6838 |
| 2021/0320024 A1* | 10/2021 | Yamauchi | .......... | H01L 21/681 |
| 2022/0068688 A1* | 3/2022 | Jo | ................... | H01L 21/683 |
| 2022/0302078 A1* | 9/2022 | Chang | .............. | H01L 24/83 |
| 2023/0163013 A1* | 5/2023 | Sreenivasan | ....... | B01L 3/502707 |
| | | | | 156/345.51 |
| 2023/0223290 A1* | 7/2023 | Chang | ............... | H01L 21/681 |
| | | | | 414/806 |
| 2023/0223377 A1* | 7/2023 | Chang | .............. | G03F 9/70 |
| | | | | 438/16 |
| 2024/0006207 A1* | 1/2024 | Nakamitsu | ......... | H01L 21/67259 |
| 2024/0047257 A1* | 2/2024 | Otsuka | ............. | H01L 21/67103 |
| 2024/0395578 A1* | 11/2024 | Sreenivasan | ....... | B41J 3/407 |
| 2024/0395766 A1* | 11/2024 | Chang | .............. | H01L 21/68 |
| 2024/0407148 A1* | 12/2024 | Sreenivasan | ....... | H05K 13/041 |
| 2025/0054798 A1* | 2/2025 | Hwang | ............. | H01L 21/6833 |

* cited by examiner

BONDING SYSTEM AND METHOD

BACKGROUND

A typical problem with substrate on substrate (e.g., wafer-on-wafer) bonding process is that the components (e.g., pads) to be bonded in the wafers are offset (misaligned) each other after the bonding process. The offset or misalignment is mainly owing to bonding under atmosphere environment is prone to uneven or irregular offsets, and cannot monitor or compensate for the offsets in situ. As such, improvements to bonding systems and methods are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
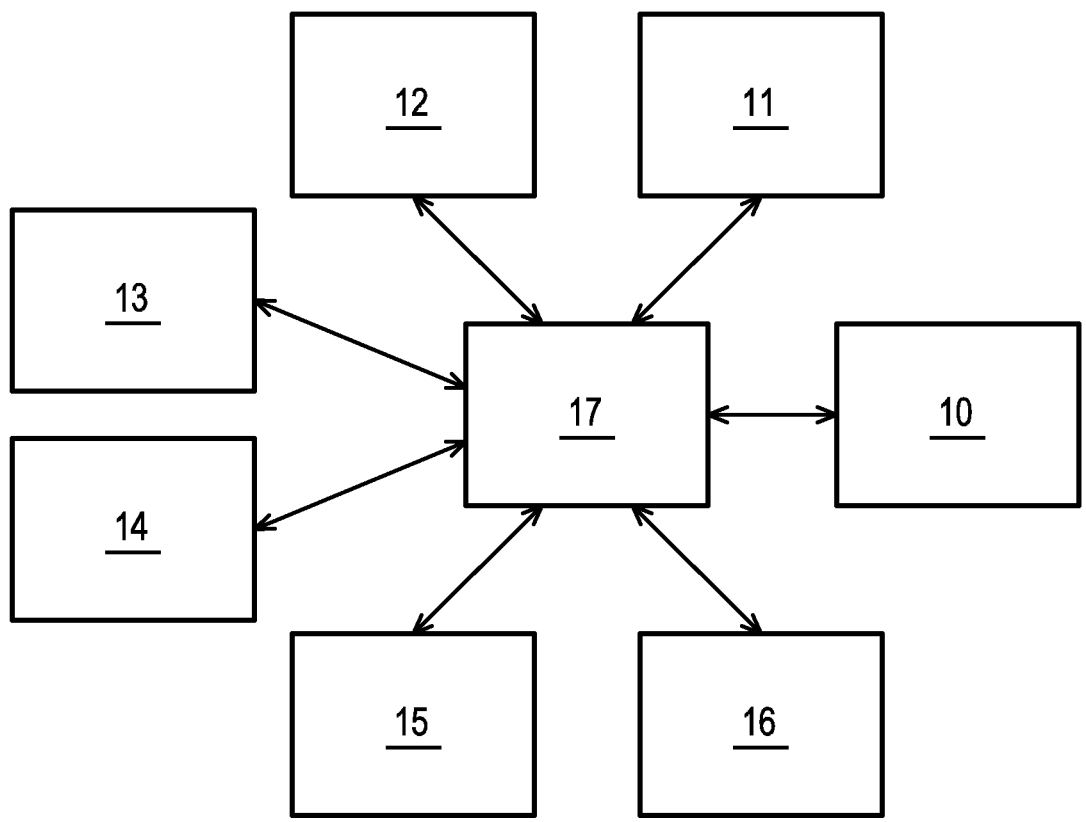
FIG. 1 schematically illustrate a block diagram of a bonding system in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Current wafer-on-wafer (WoW) bonder is designed to bond the wafers in atmosphere environment (i.e., non-vacuum environment). To achieve void less bonding or to reduce generation of voids between wafers, the bonder relies on bowing or tilting at least one of the wafers to create an initial point/edge as a start point/edge for bonding wave propagation, which results in uneven offsets in the bonded wafer stack. For example, the offsets gradually increase outward from the initial point/edge such that the offsets away from the initial point/edge are larger than the offsets near the initial point/edge. In addition, because of constrains of bonding under atmosphere environment, alignment procedures need to be done before chuck table compensation movement, and the movement-induced offset cannot be monitored or compensated in-situ. Moreover, temperature deviations or wafer warpage can cause irregular (or non-linear) offsets.

The present disclosure is related to a bonding system and a bonding method. In some embodiments, the substrates (e.g., wafers) are bonded in a vacuum state/chamber so that bowing or tilting of at least one of the substrates can be omitted. In other words, bowing or tilting of at least one of the substrates can be an option instead of a must. Since bow/tilt value can be decrease down to zero for flat-to-flat bonding under the vacuum state (pressure in the chamber is close to or equal to 0), the uneven offset problem can be improved, and in-situ (or direct alignment) monitoring or compensating can be adopted. In some embodiments, the chuck includes a temperature control structure and/or a pin array for fine adjustment of irregular (or non-linear) offset compensation.

Figure 3:
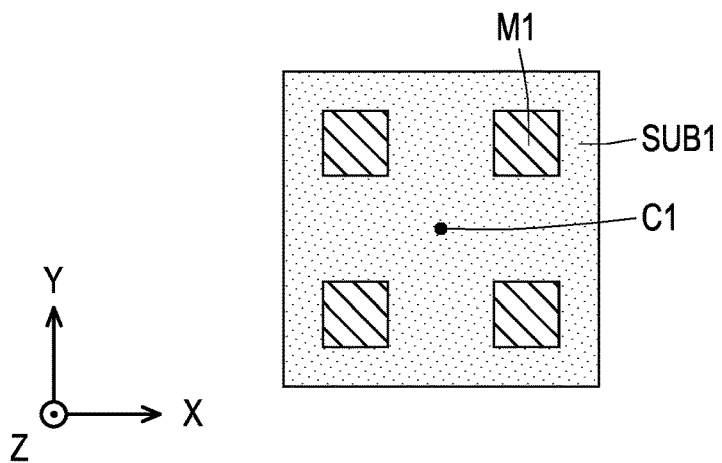
FIG. 3 and FIG. 4 schematically illustrate exemplary partial images captured by a visible light sensor module in accordance with some embodiments of the present disclosure.
Figure 4:
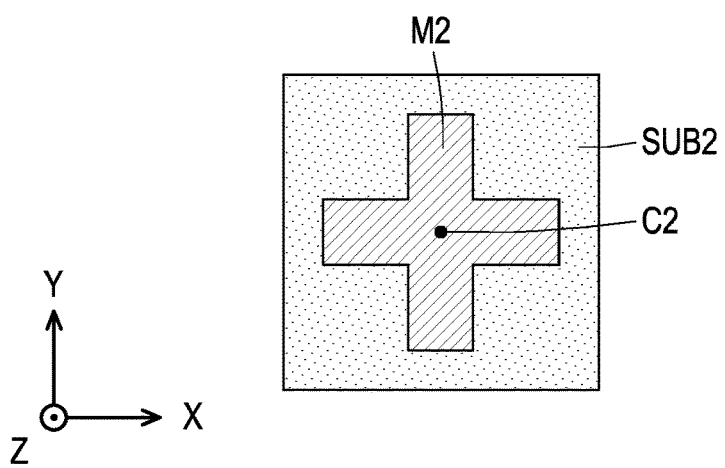
Figure 5:
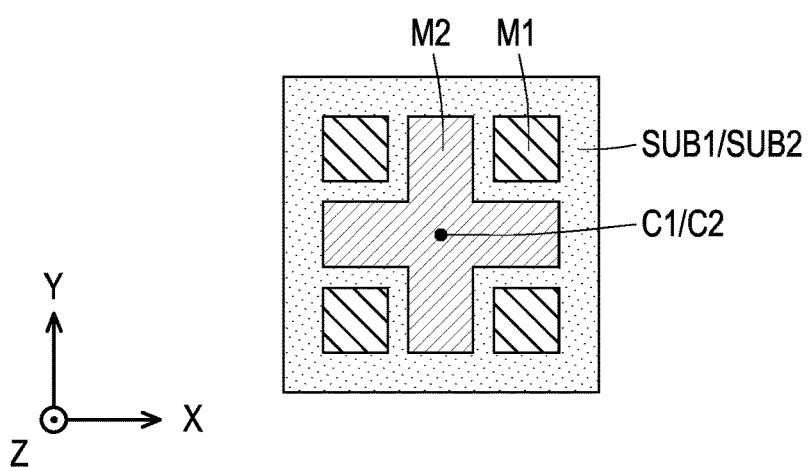
FIG. 5 schematically illustrate an exemplary partial image captured by a nonvisible light module in accordance with some embodiments of the present disclosure.
Figure 6:
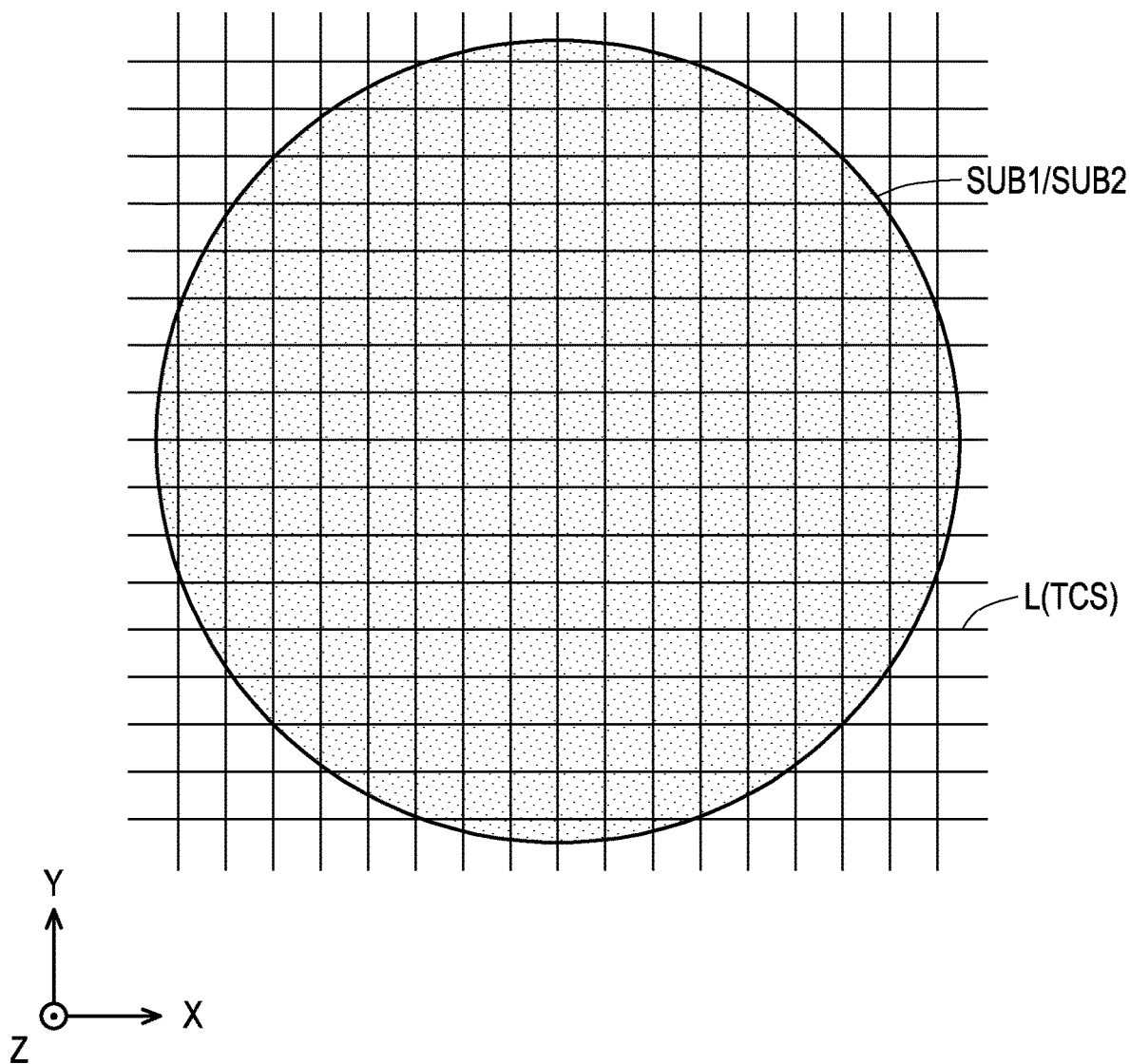
FIG. 6 schematically illustrate a partial top view of a temperature control structure in a chuck and a substrate in accordance with some embodiments of the present disclosure.
Figure 7:
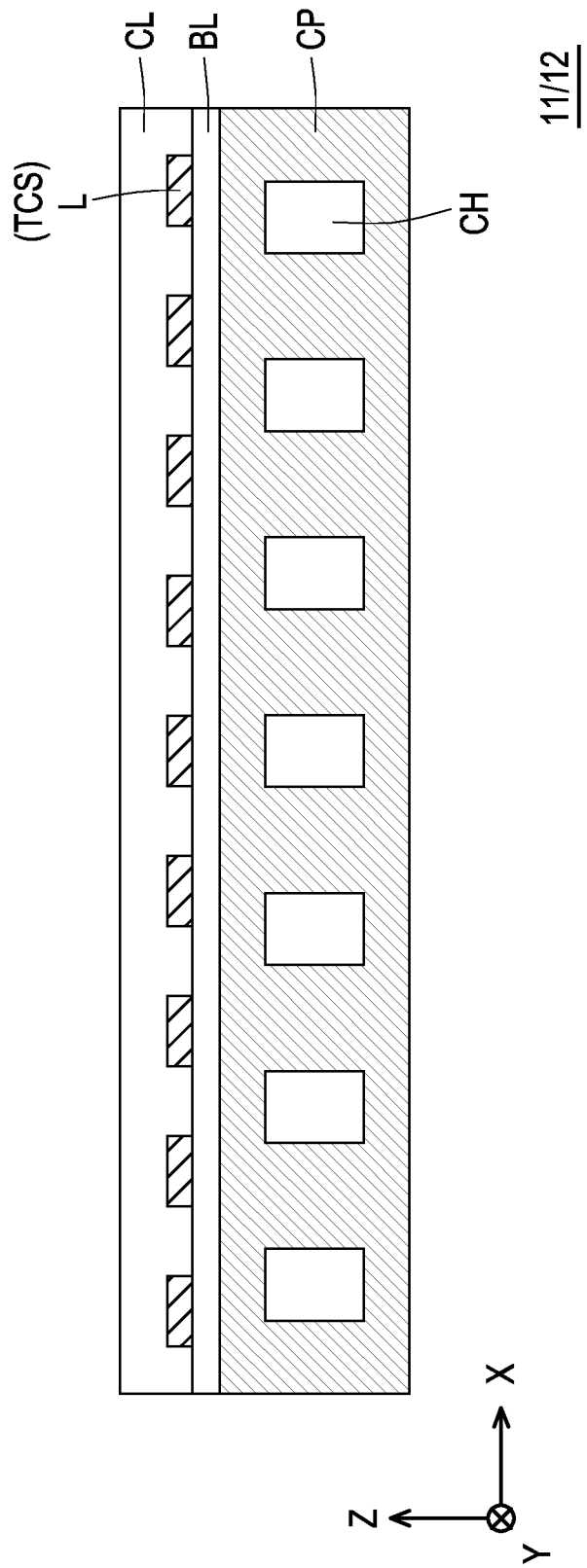
FIG. 7 schematically illustrate a cross-sectional view of a chuck in accordance with some embodiments of the present disclosure.
Figure 8:
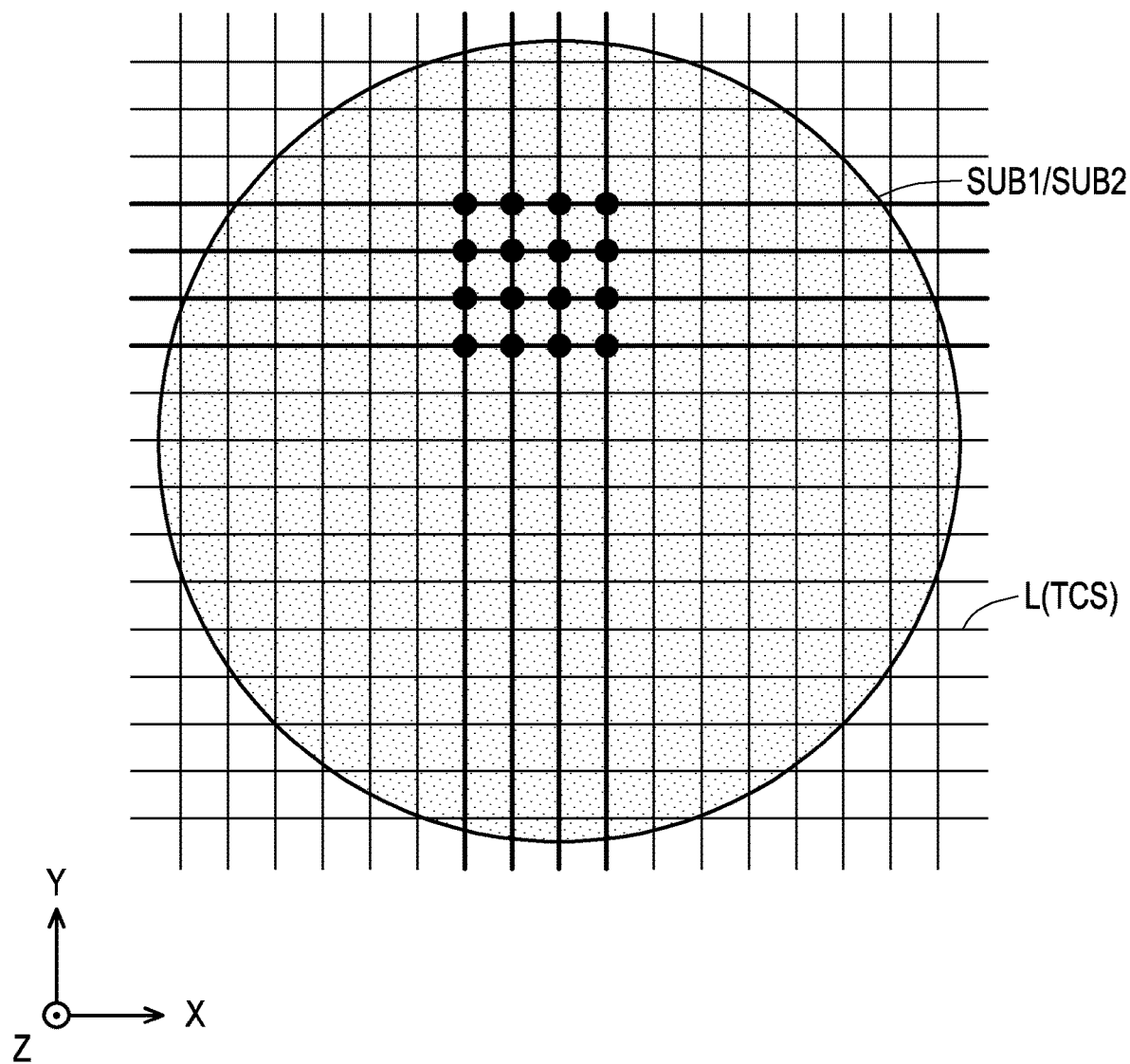
FIG. 8 and FIG. 9 schematically illustrate top views showing various temperature control examples of the temperature control structure in FIG. 2.
Figure 9:
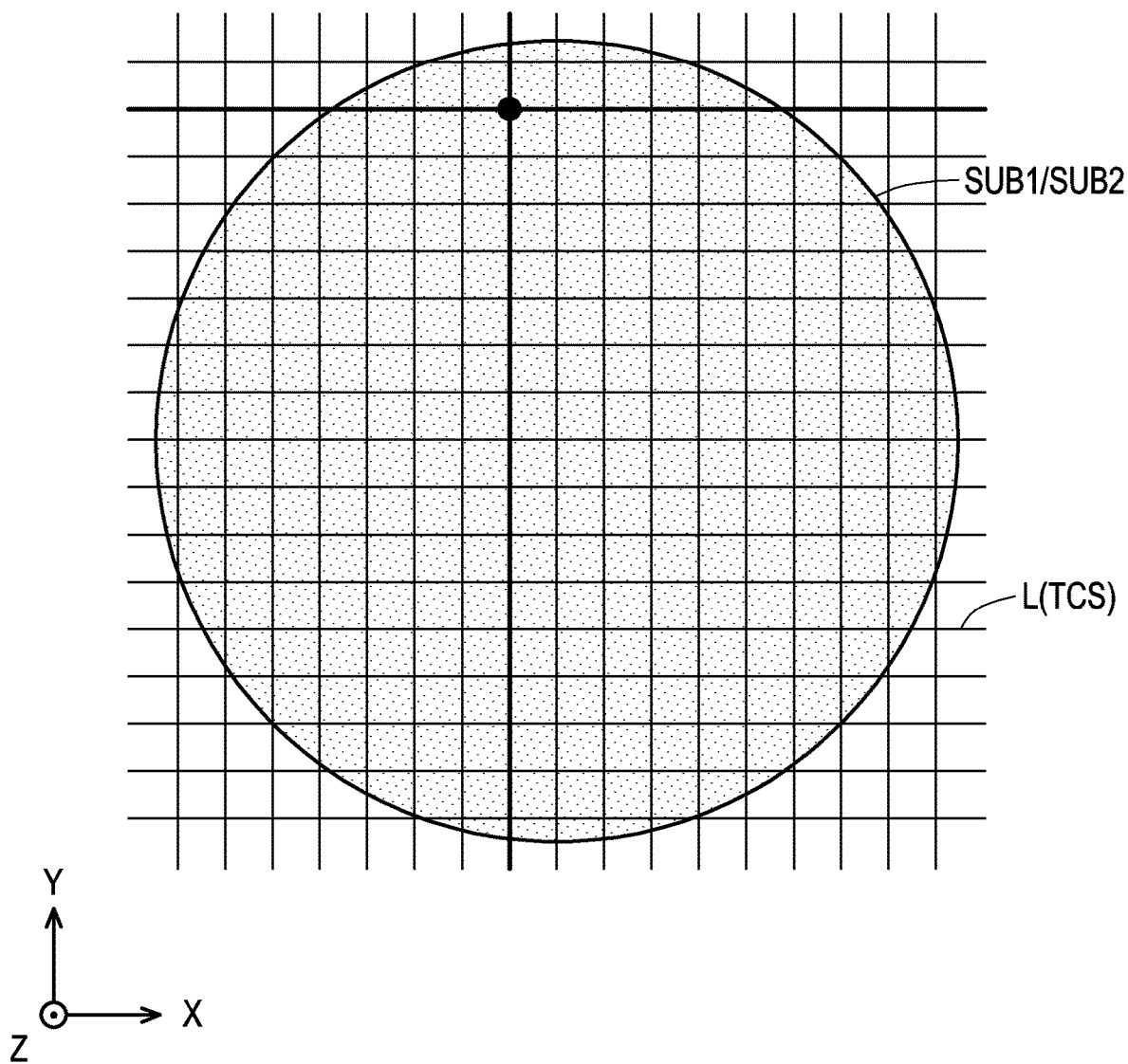
Figure 10:
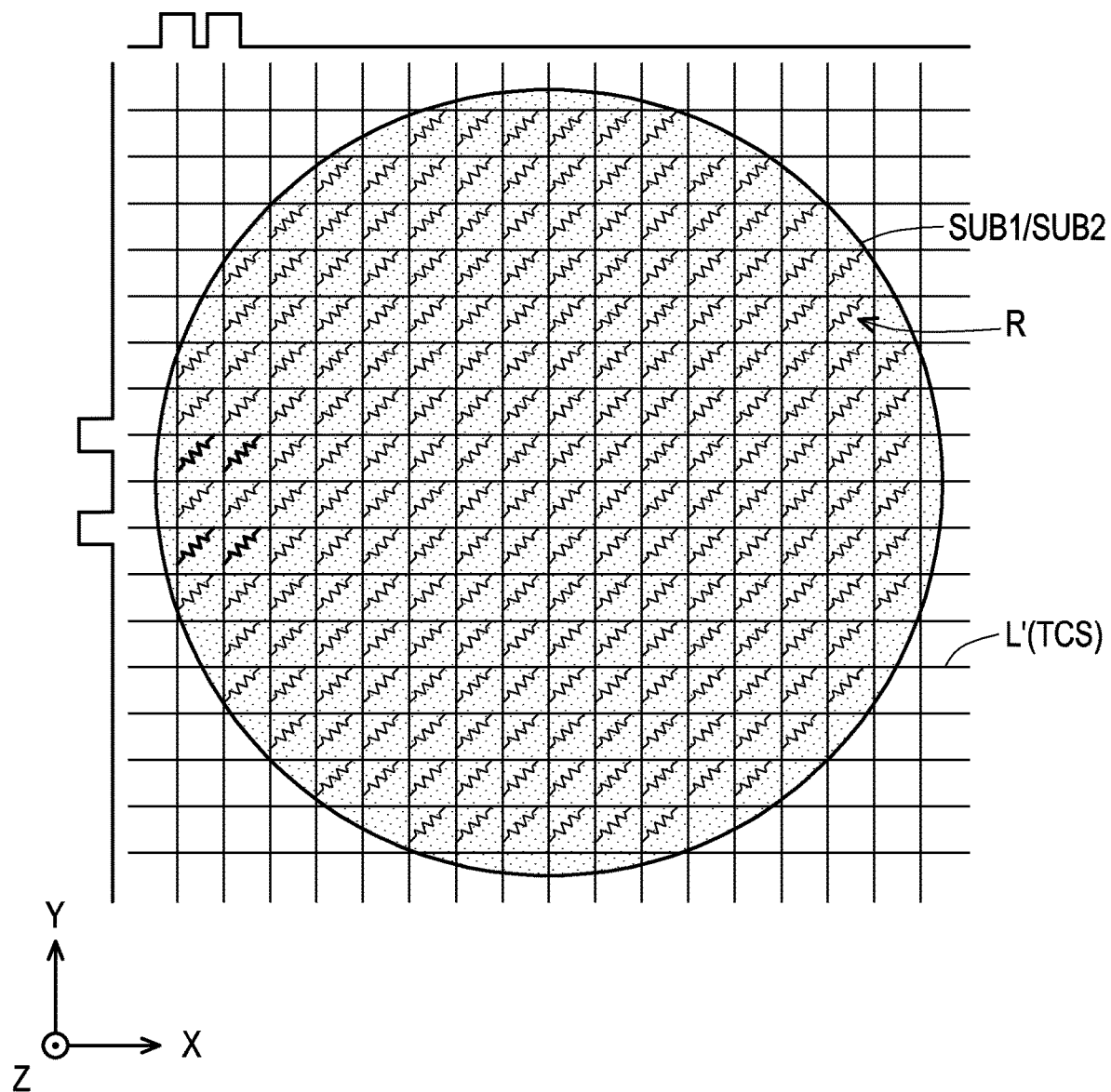
FIG. 10 through FIG. 12 schematically illustrate partial top views of temperature control structures in chucks and substrates in accordance with some other embodiments of the present disclosure.
Figure 11:
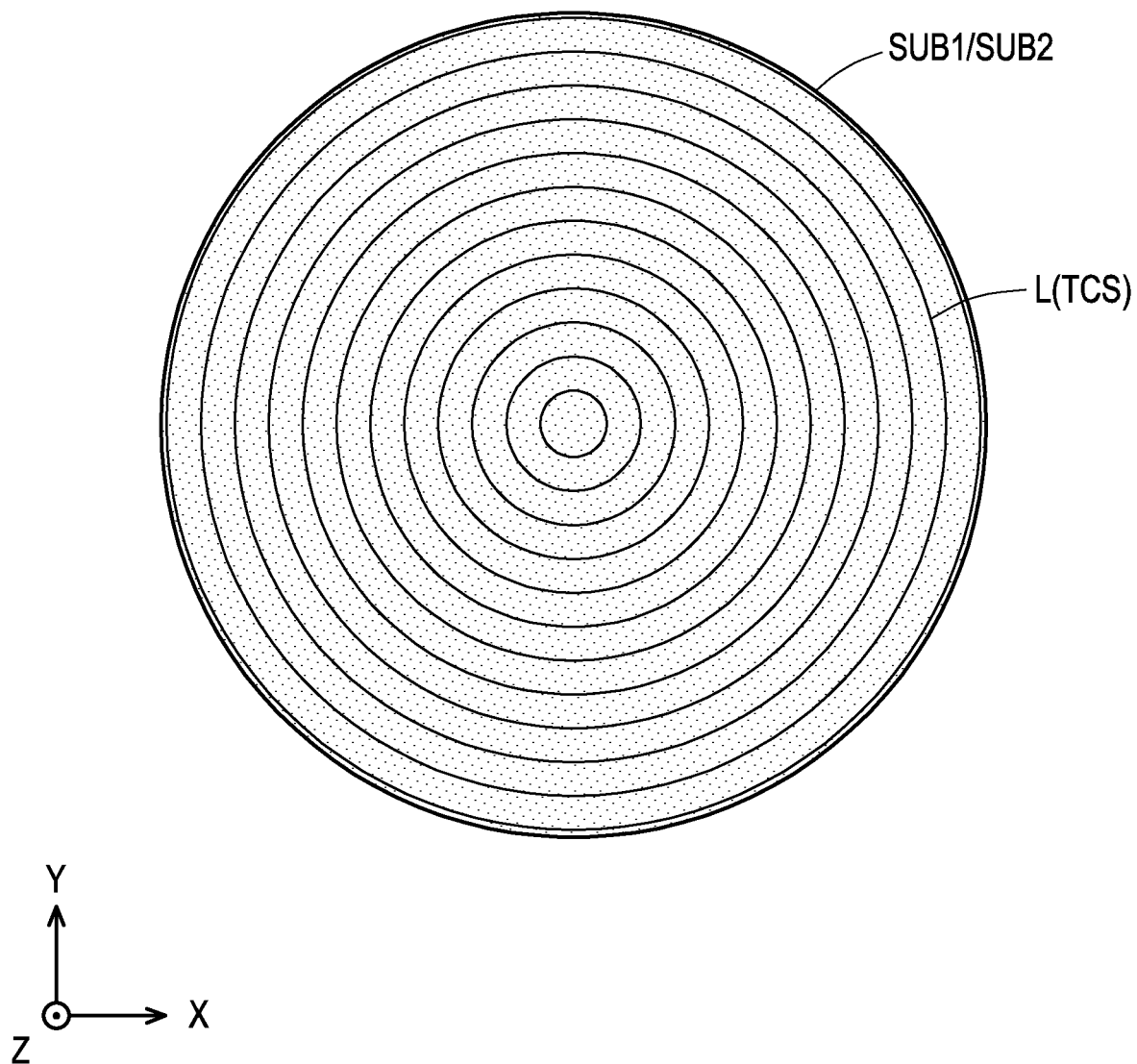
Figure 12:
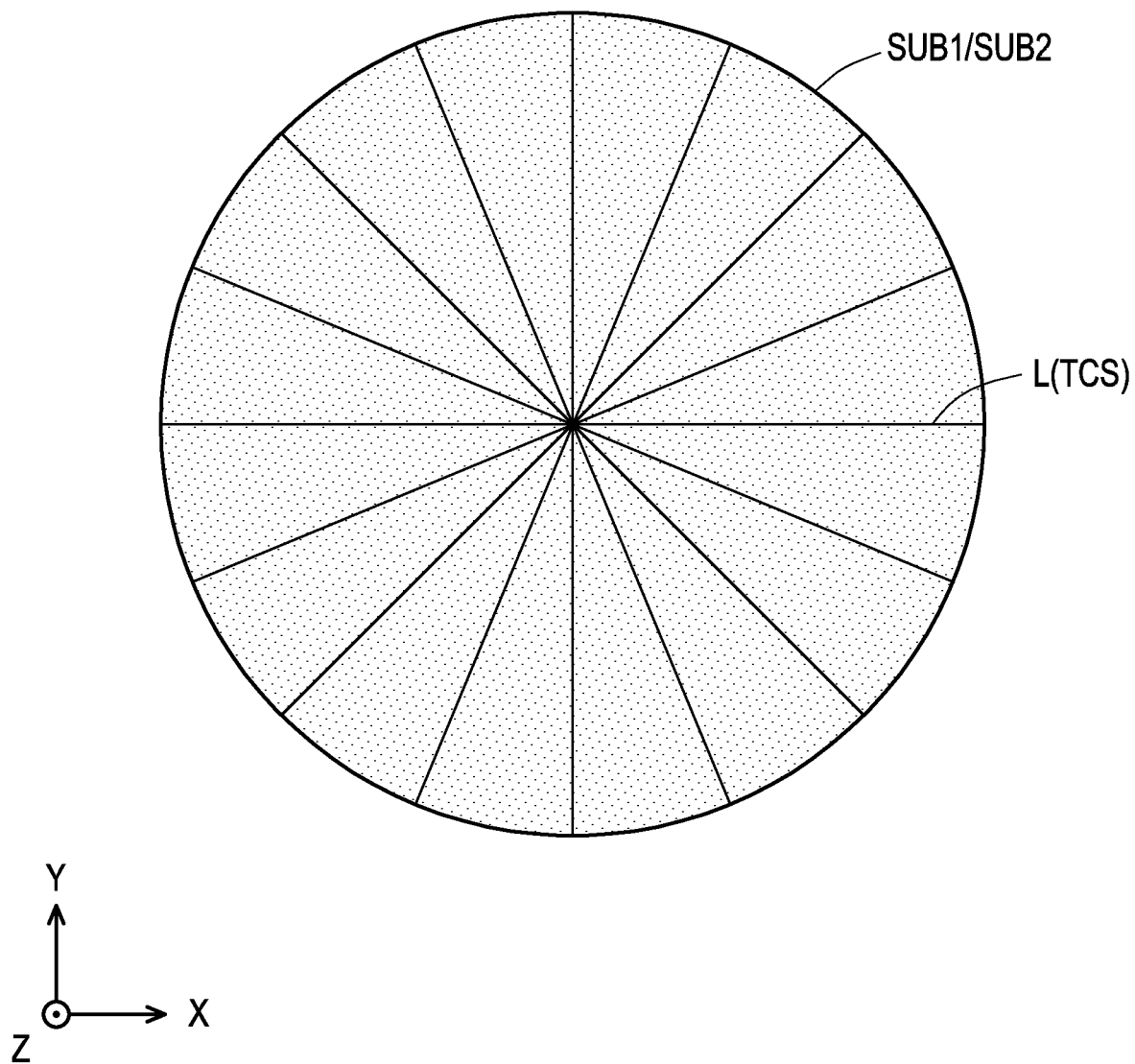
Figure 13:
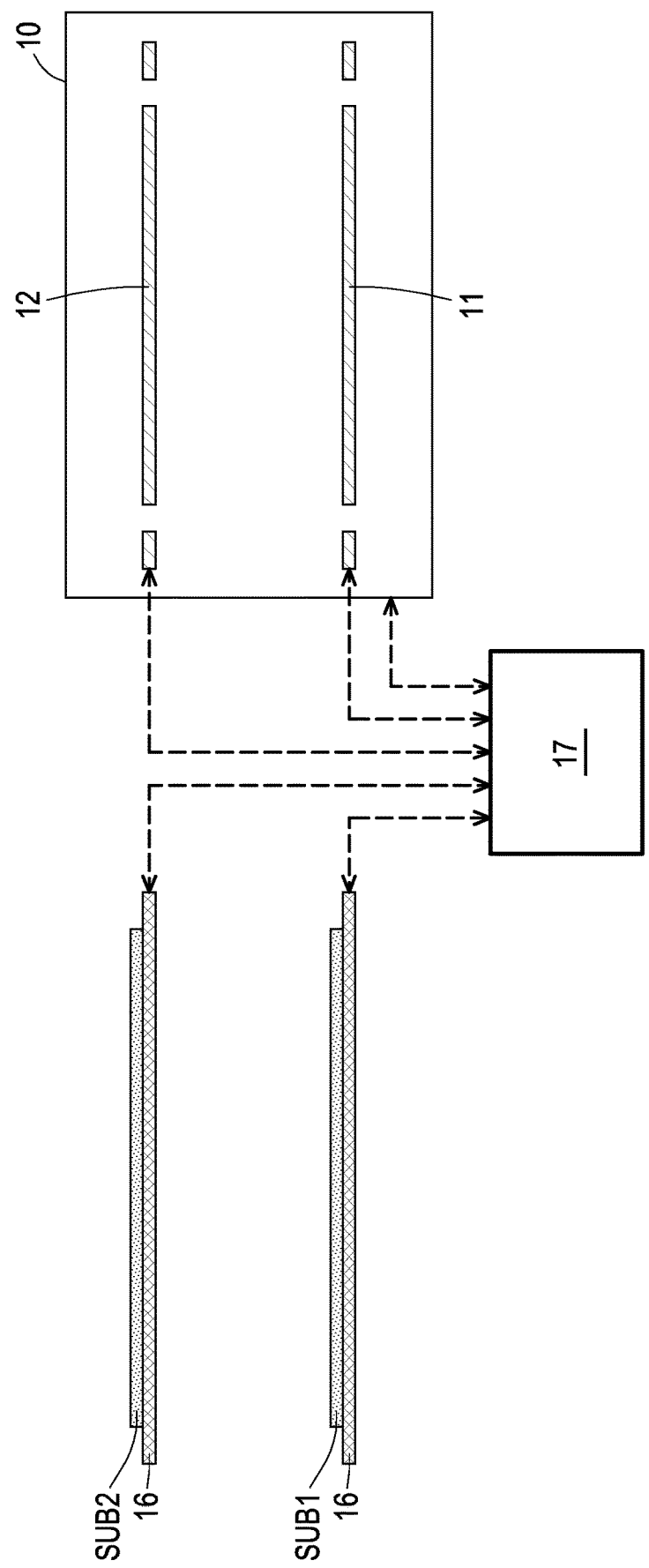
FIG. 13 schematically illustrate a bonding system in accordance with some embodiments of the present disclosure.
Figure 14:
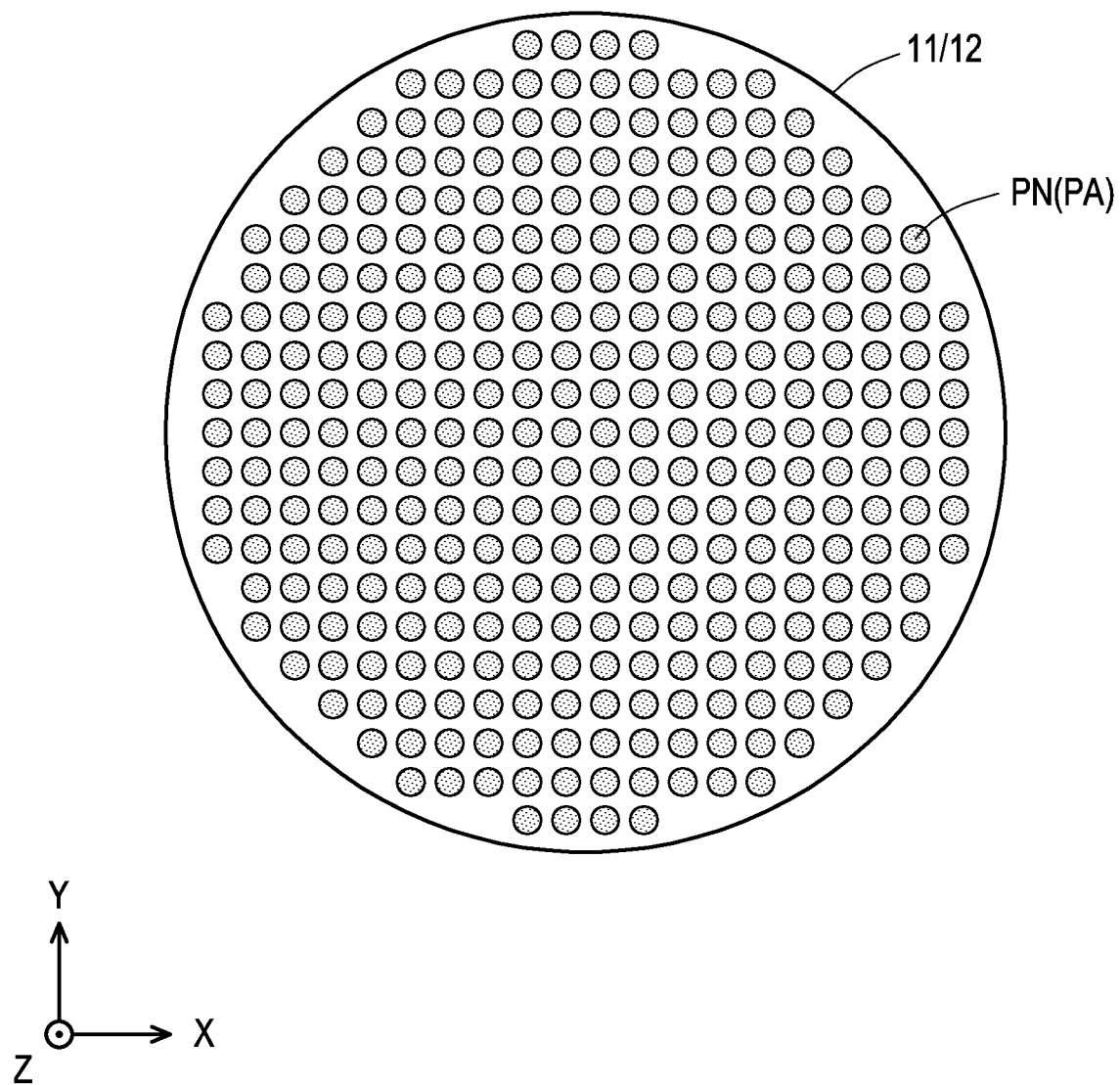
FIG. 14 and FIG. 15 schematically illustrate a top view and a cross-sectional view of a chuck in accordance with some other embodiments of the present disclosure, respectively.
Figure 15:
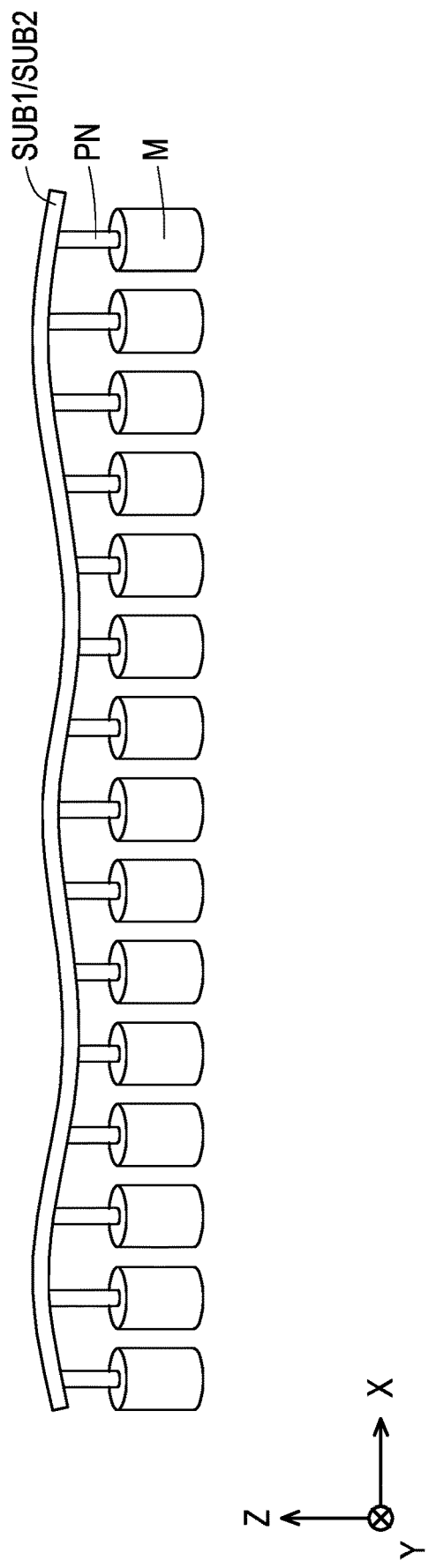

FIG. 1 schematically illustrate a block diagram of a bonding system in accordance with some embodiments of the present disclosure. FIG. 2A through FIG. 2D schematically illustrate a process flow for a bonding method in accordance with some embodiments of the present disclosure. FIG. 3 and FIG. 4 schematically illustrate exemplary partial images captured by a visible light sensor module in accordance with some embodiments of the present disclosure. FIG. 5 schematically illustrate an exemplary partial image captured by a nonvisible light module in accordance with some embodiments of the present disclosure. FIG. 6 schematically illustrate a partial top view of a temperature control structure in a chuck and a substrate in accordance with some embodiments of the present disclosure. FIG. 7 schematically illustrate a cross-sectional view of a chuck in accordance with some embodiments of the present disclosure. FIG. 8 and FIG. 9 schematically illustrate top views showing various temperature control examples of the temperature control structure in FIG. 2. FIG. 10 through FIG. 12 schematically illustrate partial top views of temperature control structures in chucks and substrates in accordance with some other embodiments of the present disclosure. FIG. 13 schematically illustrate a bonding system in accordance with some embodiments of the present disclosure. FIG. 14 and FIG. 15 schematically illustrate a top view and a cross-sectional view of a chuck in accordance with some other embodiments of the present disclosure, respectively.

Referring to FIG. 1, a bonding system 1 in accordance with some embodiments of the present disclosure is provided. The bonding system 1 may include a chamber 10, a first electrostatic chuck 11, a second electrostatic chuck 12, a visible light sensor module 13 and a nonvisible light module 14.

The chamber 10 is configured to provide a vacuum state for substrate bonding. Although not shown in FIG. 1, the chamber 10 includes a space S (please refer to FIG. 2A to FIG. 2D) to perform bonding of substrates. Although the chamber 10 has a rectangular shape in FIG. 2A to FIG. 2D, the shape of the chamber 10 is not limited thereto and may be varied according to needs.

The chamber 10 can use any of the existing chambers, and there is no limit to the type or structure of the chamber 10. In some embodiments, the chamber 10 includes a pressure adjusting unit (not shown) to adjust the pressure in the space S. In some embodiments, the chamber 10 includes a purge unit (not shown) that discharges impurities from the space S. In some embodiments, the chamber 10 includes an entrance (not shown) at one side of the chamber 10 for entry and exit of the substrates.

The first electrostatic chuck 11 and the second electrostatic chuck 12 are configured to hold a first substrate (not shown in FIG. 1; please refer to a first substrate SUB1 in FIG. 2A to FIG. 2D) and a second substrate (not shown in FIG. 1; please refer to a second substrate SUB2 in FIG. 2A to FIG. 2D), respectively.

The substrate (e.g., the first substrate and/or the second substrate) may be a device substrate, a package substrate, an interposer substrate, the like, or a combination of the above, but the present disclosure is not limited thereto. The interposer substrate may be a silicon interposer or an organic interposer, but the present disclosure is not limited thereto. In some embodiments, the substrate includes a base and layers and/or devices formed on the base. The base may be a semiconductor base, such as a bulk semiconductor, a semiconductor-on-insulator (SOI) base, or the like, which may be doped (e.g., with a p-type or an n-type dopant) or undoped. The base may be a wafer, such as a silicon wafer. Other bases, such as a multi-layered or gradient base may also be used. In some embodiments, circuits (not shown) may be formed over the base. The circuits may include active devices (e.g., transistors, diodes or the like), passive devices (e.g., capacitors, resistors, or the like) and/or an interconnect structure. In some embodiments, the interconnect structure includes a plurality of inter-metal dielectric (IMD) layers (not shown) and a plurality of metallization layers (not shown), wherein the IMD layers and the metallization layers are layered over one another in alternating fashion. In some embodiments, the metallization layers include metal lines (not shown). The metal lines may be power, ground, and/or signal lines for the active devices. In some embodiments, vias (not shown) may be formed in the IMD layers and extend between two adjacent metallization layers. In some embodiments, contacts (not shown) may be formed in one of the IMD layers to facilitate bonding to another substrate. In some embodiments, one or a plurality of alignment marks (e.g., first alignment marks M1 or second alignment marks M2 in FIG. 2A to FIG. 2D) may be formed on the base to facilitate alignment with another substrate. In some embodiments, the one or plurality of alignment marks may be formed together with other components in the substrate, but the present disclosure is not limited thereto.

The chuck (e.g., the first electrostatic chuck 11 and/or the second electrostatic chuck 12) holds the substrate by an electrostatic force. The chuck can use any of the existing chucks, and there is no limit to the type or structure of the chuck. In some embodiments, the chuck includes an electrode (not shown) embedded inside a ceramic layer (not shown) and connected to an external power supply (not shown) to enable substrate holding. In some embodiments, the chuck includes a cooling plate (not shown) and a bond layer (not shown) through which the ceramic layer is bonded to the cooling plate. In some embodiments, the chuck includes a temperature control structure (not shown) to perform temperature control on the held substrate. In some embodiments, the chuck includes one or a plurality of windows (e.g., first windows W1 or second windows W2 in FIG. 2A to FIG. 2D) for nonvisible light alignment process.

The visible light sensor module 13 is configured to capture images of a first alignment mark of the first substrate (e.g., a first alignment mark M1 of the first substrate SUB1 in FIG. 3) and a second alignment mark of the second substrate (e.g., a second alignment mark M2 of the second substrate SUB2 in FIG. 4) in the chamber 10 for substrate alignment (e.g., course alignment). In some embodiments, the visible light sensor module 13 includes one or a plurality of image sensors (not shown) for image capturing. The image sensors may include charge coupled device (CCD) image sensors, complementary metal-oxide semiconductor (CMOS) image sensors, or the like, but the present disclosure is not limited thereto.

The nonvisible light module 14 is configured to capture a combined image of the first alignment mark and the second alignment mark (please refer to FIG. 5) for substrate alignment (e.g., fine alignment). In some embodiments, the nonvisible light module 14 is an infrared light module that includes an infrared light emitter (e.g., a light emitter 140 in FIG. 2C) that emits infrared light (not shown) and an infrared light receiver (e.g., a light receiver 141 in FIG. 2C) that receives the infrared light, but the present disclosure is not limited thereto.

The bonding system 1 may further include other elements according to different requirements. In some embodiments, the bonding system 1 may further include one or a plurality of robotic arms 15 (only one is shown) to transport the substrates. In some embodiments, the bonding system 1 may further include one or a plurality of temperature control plates 16 (only one is shown) to control temperatures of the substrates before the substrates are held by the chucks. In some embodiments, the bonding system 1 may further include a controller 17 to control the operation of the chamber 10, the first electrostatic chuck 11, the second electrostatic chuck 12, the visible light sensor module 13, the nonvisible light module 14, the robotic arm 15 and the temperature control plate 16.

For example, the controller 17 is coupled to the chamber 10 to open or close the entrance of the chamber 10, to control the timing and/or duration of discharging impurities from the space S, to control the pressure in the space S, to control the timing and/or duration of the vacuum state, or etc. For example, the controller 17 is coupled to the first electrostatic chuck 11 to control the first electrostatic chuck 11 to hold or release the first substrate, to control the motion (including movement in directions X, Y, or Z or rotation about the Z axis) of the first electrostatic chuck 11, or etc. For example, the controller 17 is coupled to the second electrostatic chuck 12 to control the second electrostatic chuck 12 to hold or release the second substrate, to control the motion (including movement in direction X, Y, or Z or rotation about the Z axis) of the second electrostatic chuck 12, or etc. For example, the controller 17 is coupled to the visible light sensor module 13 to control the visible light sensor module 13 to capture images, to control the motion of the visible light sensor module 13, to control the focal length of the visible light sensor module 13 (if the focal length is variable), or etc. For example, the controller 17 is coupled to the nonvisible light module 14 to control the nonvisible light module 14 to capture images, to control the motion of the nonvisible light module 14, to control the focal length of the nonvisible light module 14 (if the focal length is variable), or etc. For example, the controller 17 is coupled to the robotic arm 15 to control the robotic arm 15 to transport the substrates between the chuck and the temperature control plate 16, between a carrier in other processing station and the temperature control plate 16, or between a carrier in other processing station and the chuck. For example, the controller 17 is coupled to the temperature control plate 16 to control the temperature of the substrate(s) placed on the temperature control plate 16.

Referring to FIG. 2A through FIG. 2D, a process flow for a bonding method in accordance with some embodiments of the present disclosure is provided. For example, the bonding method includes: holding a first substrate SUB1 in a chamber 10; holding a second substrate SUB2 in the chamber 10 with the second substrate SUB2 facing the first substrate SUB1; performing a first alignment process on the first substrate SUB1 and the second substrate SUB2; performing a second alignment process on the first substrate SUB1 and the second substrate SUB2 after performing the first alignment process; vacuuming the chamber 10; and bonding the first substrate SUB1 and the second substrate SUB2 after vacuuming the chamber 10.

In some embodiments, the first alignment process includes a course alignment performed by the visible light sensor module 13, while the second alignment process includes a fine alignment performed by the nonvisible light module 14, wherein a distance (e.g., D2 in FIG. 2C) between the first substrate SUB1 and the second substrate SUB2 when performing the fine alignment is less than a distance (e.g., D1 in FIG. 2A) between the first substrate SUB1 and the second substrate SUB2 when performing the course alignment. The distance between the first substrate SUB1 and the second substrate SUB2 refers to the minimum distance in direction Z between the first substrate SUB1 and the second substrate SUB2.

Figure 2A:
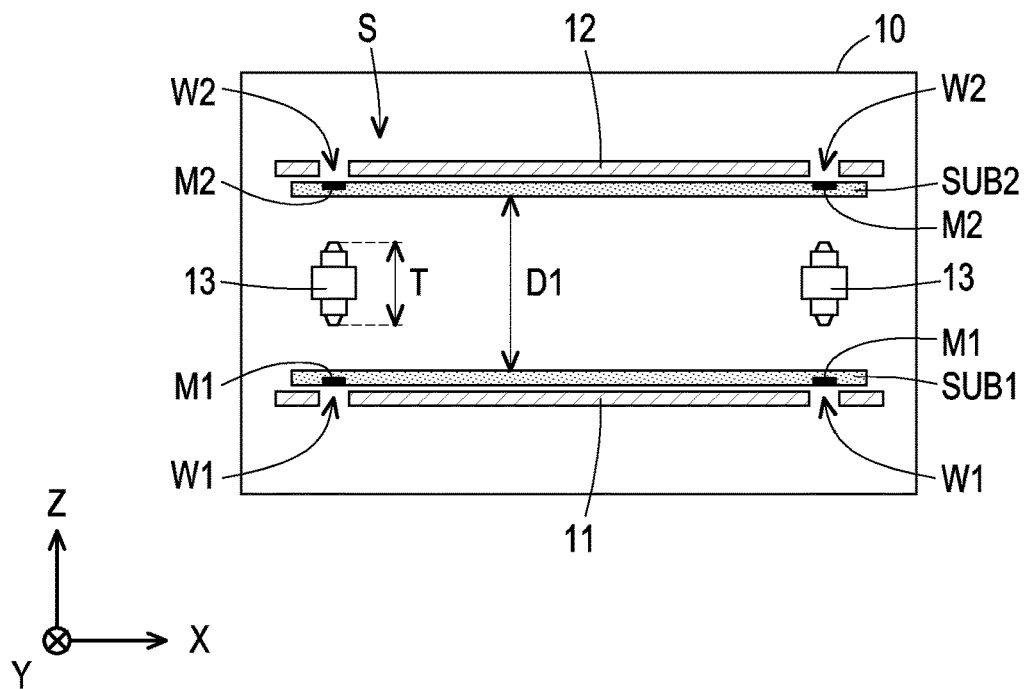
FIG. 2A through FIG. 2D schematically illustrate a process flow for a bonding method in accordance with some embodiments of the present disclosure.

Specifically, as shown in FIG. 2A, the first substrate SUB1 and the second substrate SUB2 can be respectively held by the first electrostatic chuck 11 and the second electrostatic chuck 12 in the chamber 10, and the first substrate SUB1 and the second substrate SUB2 are disposed to face each other.

The first alignment process is performed after the first substrate SUB1 and the second substrate SUB2 are respectively held by the first electrostatic chuck 11 and the second electrostatic chuck 12 in the chamber 10. The first alignment process may include the course alignment performed by the visible light sensor module 13 as well as a first compensation movement subsequent to the course alignment and performed by at least one of the first electrostatic chuck 11 and the second electrostatic chuck 12.

In some embodiments, the course alignment includes capturing an image (please refer to FIG. 3) of a first alignment mark M1 of the first substrate SUB1 and capturing an image (please refer to FIG. 4) of a second alignment mark M2 of the second substrate SUB2 via the visible light sensor module 13 to determine positions of the first alignment mark M1 and the second alignment mark M2. In some embodiments, the position of the first alignment mark M1 is determined by a center C1 (shown in FIG. 3) of the first alignment mark M1, and the position of the second alignment mark M2 is determined by a center C2 (shown in FIG. 4) of the second alignment mark M2. In FIG. 3 and FIG. 4, the first alignment mark M1 is composed of four squares, and the second alignment mark M2 is composed of a cross, but the present disclosure is not limited thereto. The patterns of the first alignment mark M1 and the second alignment mark M2 can be changed according to actual needs.

In some embodiments, as shown in FIG. 2A, the visible light sensor module 13 is positioned between the first substrate SUB1 and the second substrate SUB2 when capturing the images of first alignment mark M1 and the second alignment mark M2, but the present disclosure is not limited thereto. The relative arrangement relationship between the first substrate SUB1, the second substrate SUB2 and the visible light sensor module 13 can be changed as long as the visible light sensor module 13 can capture images of the first alignment mark M1 and the second alignment mark M2.

In some embodiments, as shown in FIG. 2A, the visible light sensor module 13 may include two image sensors respectively focusing at the first alignment mark M1 and the second alignment mark M2 overlapped with the first alignment mark M1. In the embodiments in which the visible light sensor module 13 is positioned between the first substrate SUB1 and the second substrate SUB2 to perform the course alignment, the distance D1 between the first substrate SUB1 and the second substrate SUB2 when performing the course alignment is larger than a total thickness T of the two image sensors, so that the two image sensors can be positioned between the first substrate SUB1 and the second substrate SUB2.

In some embodiments, the first substrate SUB1 includes a plurality of first alignment marks M1, and the second substrate SUB2 includes a plurality of second alignment marks M2. In such embodiments, the bonding system 1 may include a plurality of visible light sensor modules 13 disposed corresponding to the plurality of alignment mark groups (each alignment mark group corresponding to one first alignment mark M1 and one second alignment mark M2 overlapped with the one first alignment mark M1).

Figure 2B:
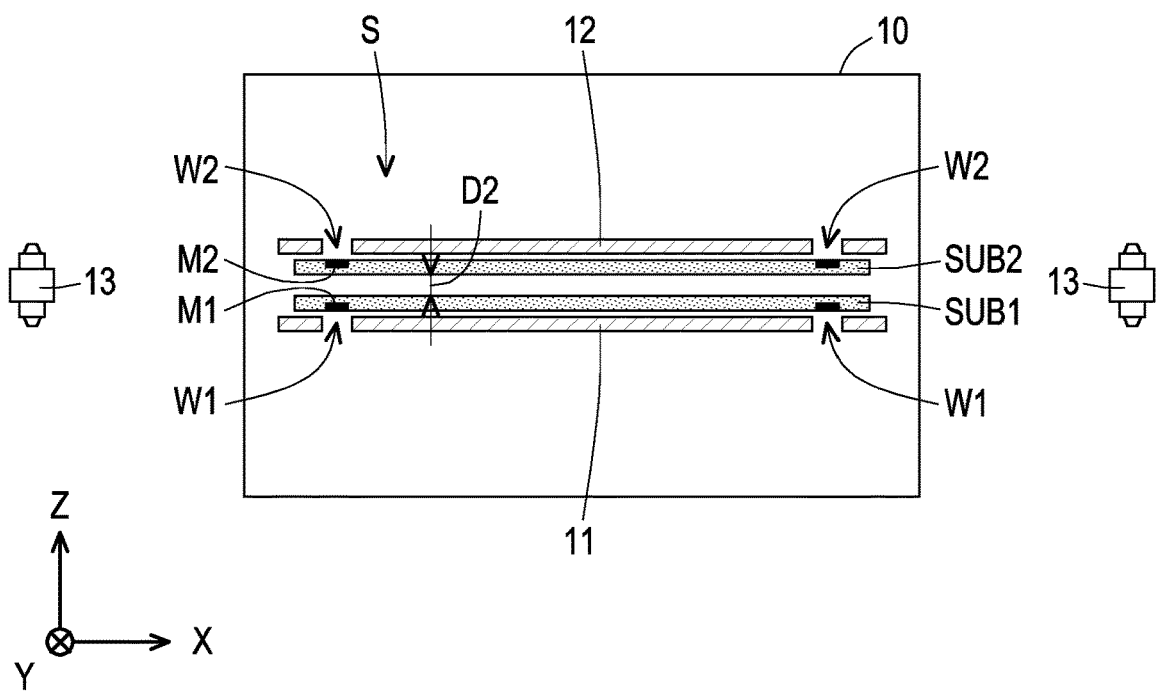

As shown in FIG. 2B, after the course alignment is completed, i.e., after the positions of the first alignment mark M1 and the second alignment mark M2 are determined, the visible light sensor module 13 is moved away from the first substrate SUB1 and the second substrate SUB2. In some embodiments, the visible light sensor module 13 is moved out of the chamber 10, but the present disclosure is not limited thereto. In some alternative embodiments, the visible light sensor module 13 may stay in the chamber and not positioned between the first substrate SUB1 and the second substrate SUB2.

In some embodiments, the chamber 10 is vacuumed to a vacuum state (pressure in the chamber 10 is close to or equal to 0) after the visible light sensor module 13 is moved out of the chamber 10, but the present disclosure is not limited thereto. In some alternative embodiments, the chamber 10 may be vacuumed to the vacuum state at any point of time before bonding the first substrate SUB1 and the second substrate SUB2. For example, the chamber 10 may be vacuumed to the vacuum state after the first substrate SUB1 and the second substrate SUB2 are sent into the chamber 10 and before the first alignment process is performed, but the present disclosure is not limited thereto.

The first compensation movement is performed after the visible light sensor module 13 is moved away from the first substrate SUB1 and the second substrate SUB2. The first compensation movement may include making at least one of the first electrostatic chuck 11 and the second electrostatic chuck 12 move in the direction X or Y or rotate about the Z axis to change the relative position of the first alignment mark M1 and the second alignment mark M2 so that the first alignment mark M1 and the second alignment mark M2 are aligned in the direction Z.

In some embodiments, the bonding method further includes reducing a distance between the first substrate SUB1 and the second substrate SUB2 before performing the second alignment process. For example, the distance between the first substrate SUB1 and the second substrate SUB2 can be reduced from the distance D1 shown in FIG. 2A to the distance D2 shown in FIG. 2B by making at least one of the first electrostatic chuck 11 and the second electrostatic chuck 12 move in the direction Z. In some embodiments, performing the first compensation movement and reducing the distance between the first substrate SUB1 and the second substrate SUB2 are after vacuuming the chamber 10. In some embodiments, performing the first compensation movement and reducing the distance between the first substrate SUB1 and the second substrate SUB2 are performed simultaneously. In some embodiments, performing the first compensation movement and reducing the distance between the first substrate SUB1 and the second substrate SUB2 are performed sequentially.

The second alignment process is performed after performing the first compensation movement and reducing the distance between the first substrate SUB1 and the second substrate SUB2. In consideration of the factors such as the depth of field of the nonvisible light module 14 (e.g., the depth of field of the light receiver 141), the total thickness variation of each of the first substrate SUB1 and the second substrate SUB2, and the coplanarity of each of the first electrostatic chuck 11 and the second electrostatic chuck 12, the distance D2 between the first substrate SUB1 and the second substrate SUB2 when performing the second alignment process is 0 μm to 5 μm. Namely, the first substrate SUB1 and the second substrate SUB2 may be close to each other or contact each other when performing the second alignment process.

The second alignment process may include the fine alignment performed by the nonvisible light module 14 as well as a second compensation movement subsequent to the fine alignment and performed by at least one of the first electrostatic chuck 11 and the second electrostatic chuck 12.

In some embodiments, the fine alignment includes capturing a combined image (please refer to FIG. 5) of the first alignment mark M1 of the first substrate SUB1 and the second alignment mark M2 of the second substrate SUB2 via the nonvisible light module 14 to determine an offset (e.g., offsets in directions X and Y) between centers (e.g., center C1 of the first alignment mark M1 and center C2 of the second alignment mark M2 in FIG. 5) of the first alignment mark M1 and the second alignment mark M2.

Figure 2C:
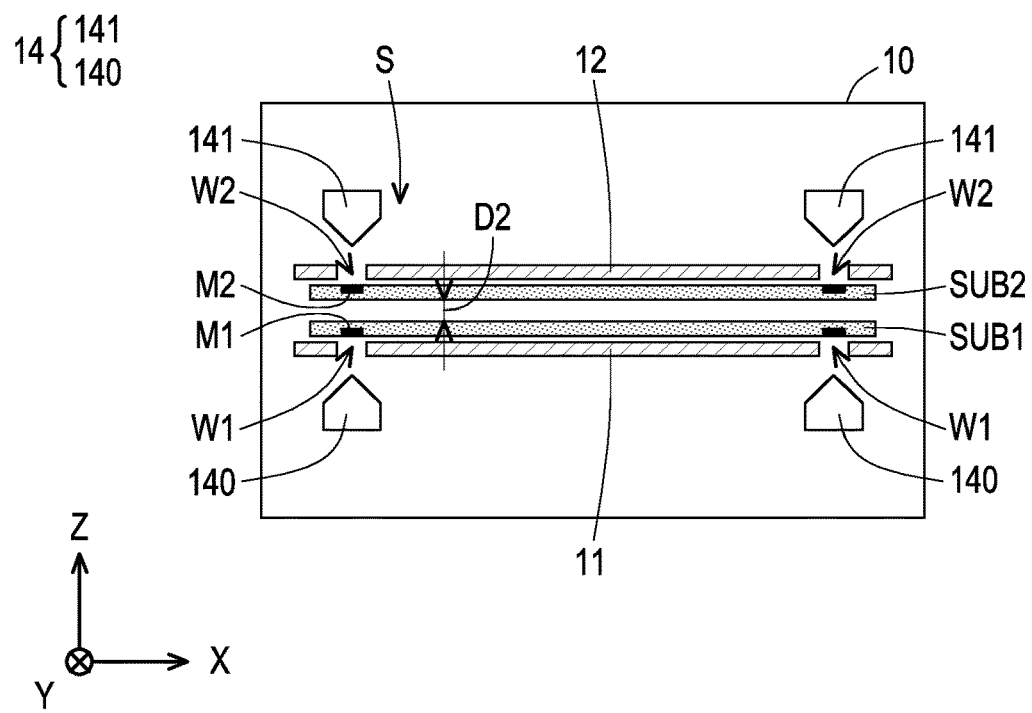

In some embodiments, as shown in FIG. 2C, the nonvisible light module 14 includes a light emitter 140 and a light receiver 141. In some embodiments, the nonvisible light module 14 is an infrared light module, and the light emitter 140 and the light receiver 141 are respectively an infrared light emitter that emits infrared light (not shown) and an infrared light receiver that receives the infrared light, but the present disclosure is not limited thereto.

In some embodiments, as shown in FIG. 2C, the nonvisible light module 14 is a transmissive type nonvisible light module, and the light emitter 140 and the light receiver 141 are respectively located at a side of the first electrostatic chuck 11 away from the first substrate SUB1 and a side of the second electrostatic chuck 12 away from the second substrate SUB2. The first electrostatic chuck 11 has a first window W1 that allows nonvisible light to pass through and disposed corresponding to the first alignment mark M1. i.e., the first window W1 is overlapped with the first alignment mark M1 in the direction Z. The second electrostatic chuck 12 has a second window W2 that allows nonvisible light to pass through and disposed corresponding to the second alignment mark M2, i.e., the second window W2 is overlapped with the second alignment mark M2 in the direction Z. Since the first substrate SUB1 and the second substrate SUB2 are transmissive to the nonvisible light, the light receiver 141 is able to capture the combined image (please refer to FIG. 5) of the first alignment mark M1 and the second alignment mark M2 via the first window W1 and the second window W2.

In some alternative embodiments, although not shown, the nonvisible light module 14 is a reflective type nonvisible light module, and the light emitter 140 and the light receiver 141 are both located at a side of the first electrostatic chuck 11 away from the first substrate SUB1 or both located at a side of the second electrostatic chuck 12 away from the second substrate SUB2.

In some embodiments, the first substrate SUB1 includes a plurality of first alignment marks M1, and the second substrate SUB2 includes a plurality of second alignment marks M2. In such embodiments, the first electrostatic chuck 11 has a plurality of first windows W1 respectively overlapped with the plurality of first alignment marks M1, and the second electrostatic chuck 12 has a plurality of second windows W2 respectively overlapped with the plurality of the plurality of second alignment marks M2. In addition, the bonding system 1 may include a plurality of nonvisible light module 14 disposed corresponding to the plurality of alignment mark groups (each alignment mark group corresponding to one first alignment mark M1 and one second alignment mark M2 overlapped with the one first alignment mark M1).

The second compensation movement is performed after the fine alignment is completed, i.e., after the offsets between centers of the first alignment marks M1 and the second alignment marks M2 are determined. The second compensation movement may include making at least one of the first electrostatic chuck 11 and the second electrostatic chuck 12 move in the direction X or Y or rotate about the Z axis to minimize the offsets between centers of the first alignment marks M1 and the second alignment marks M2 so that the first alignment mark M1 and the second alignment mark M2 are aligned in the direction Z. In some embodiments, the second alignment process may be performed once or more than once for better alignment.

The bonding of the substrates may be performed after the first alignment mark M1 and the second alignment mark M2 are aligned in the direction Z. In the embodiments in which the distance D2 is larger than 0 μm, the bonding method further includes reducing the distance D2 between the first substrate SUB1 and the second substrate SUB2 down to 0 μm before bonding of the substrates. For example, the distance D2 can be reduced down to 0 μm by making at least one of the first electrostatic chuck 11 and the second electrostatic chuck 12 move in the direction Z. In some embodiments, performing the second compensation movement and reducing the distance between the first substrate SUB1 and the second substrate SUB2 are performed simultaneously. In some embodiments, performing the second compensation movement and reducing the distance between the first substrate SUB1 and the second substrate SUB2 are performed sequentially.

Figure 2D:
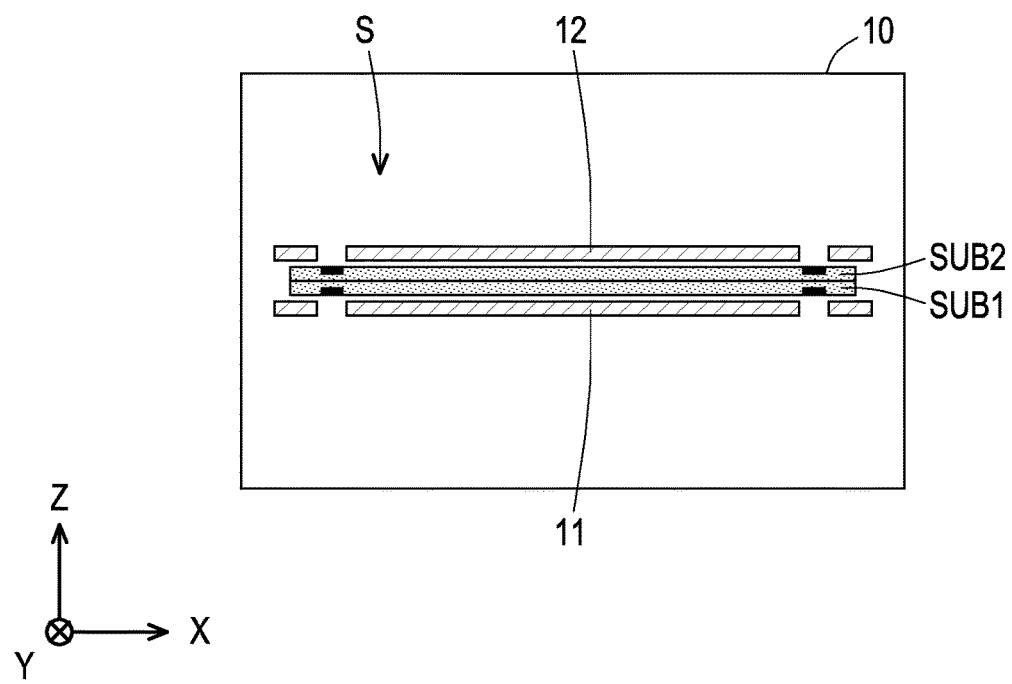

As shown in FIG. 2D, a bonding process is performed to bond the first substrate SUB1 and the second substrate SUB2. For example, bonding conductors (not shown) of the first substrate SUB1 and bonding conductors (not shown) of the second substrate SUB2 are bonded to each other via metal-to-metal bonding, and a bonding dielectric layer (not shown) of the first substrate SUB1 and a bonding dielectric layer (not shown) of the second substrate SUB2 are bonded to each other via dielectric-to-dielectric fusion bonding, but the present disclosure is not limited thereto.

In the bonding method of the embodiments, bonding of the substrates in a vacuum state/chamber helps to reduce the need to bow or tilt the substrates, and thus the uneven offset problem can be improved, and in-situ (or direct alignment) monitoring or compensating can be adopted. In addition, the second alignment process (including the fine alignment) subsequent to the first alignment process (including the course alignment) helps to monitor and/or compensate the movement-induced offset (e.g., the offset induced by the first compensation movement) before bonding of the substrates, and thus bonding accuracy can be improved.

According to different needs, the bonding method can selectively include one or more steps. In some embodiments, the bonding method may further include performing local temperature control on at least one of the first substrate SUB1 and the second substrate SUB2 before bonding the first substrate SUB1 and the second substrate SUB2 for fine adjustment of irregular (or non-linear) offset compensation.

As shown in FIG. 6 and FIG. 7, each of the first electrostatic chuck 11 and the second electrostatic chuck 12 may include a ceramic layer CL, a cooling plate CP and a temperature control structure TCS located between the ceramic layer CL and the cooling plate CP. The cooling plate CP may have coolant channels CH such that temperature of the cooling plate CP can be controlled by connecting the cooling plate CP to a temperature control unit (e.g., a chiller) which circulates fluid, but the present disclosure is not limited thereto. In some embodiments, each of the first electrostatic chuck 11 and the second electrostatic chuck 12 further includes a bonding layer BL, and the ceramic layer CL can be bonded to the cooling plate CP through the bonding layer BL.

The temperature control structure TCS may be disposed on the bonding layer BL. In some embodiments, the temperature control structure TCS includes a patterned electric heating layer L, and the patterned electric heating layer L includes a checkerboard pattern (as shown in FIG. 6), a concentric pattern (as shown in FIG. 11), a radial pattern (as shown in FIG. 12I), or a combination of the above, but the present disclosure is not limited thereto.

In some embodiments, the patterned electric heating layer L includes a plurality of electric heating wires, and intersection points of the plurality of electric heating wires can be used as temperature control points. The material of the plurality of electric heating wires may be NiCr, FeCrAl, CuNi, or other electric heating materials that can be heated by applying an electric current. By applying electric current to some of the wires, corresponding intersection point(s) can be heated up, thereby enabling local temperature control. For example, as shown in FIG. 8, by applying current to four horizontal electric heating wires and four vertical electric heating wires, sixteen corresponding intersection points can be heated up, thereby enabling local temperature control (the temperature of the region where the sixteen intersection points are located is higher than that of the other regions). Moreover, as shown in FIG. 9, by applying current to one horizontal electric heating wire and one vertical electric heating wire, one corresponding intersection point can be heated up, thereby enabling local temperature control (the temperature of the region where the intersection point is located is higher than that of the other regions). Through local temperature control at substrate backside, thermal expansion and contraction can be used to compensate irregular (or non-linear) offsets.

In some embodiments, as shown in FIG. 10, scanning technique of specific row and column can be applied to a plurality of conductive wires L' to control individual intersection points to reduce wire numbers. In some embodiments, a plurality of resistors R may be included, wherein each resistor R is electrically connected to a corresponding horizontal conductive wire L' and a corresponding vertical conductive wire L'. The material of the plurality of conductive wires L' may be selected from electric heating materials or selected from other conductive materials. By applying voltage difference to the horizontal conductive wire L' and the vertical conductive wire L' connected to the resistor R to make the voltage across the resistor R not zero, such that electric current flows through the resistor R to generate heat, thereby realizing local temperature control.

In some embodiments, although not shown, the temperature control structure TCS includes other heat generating components such as a plurality of laser diodes arranged in a checkerboard pattern, a concentric pattern, a radial pattern, or a combination of the above. The plurality of laser diodes can be used as temperature control points to enable local temperature control. Other local temperature control methods may be integrated into each of the first electrostatic chuck 11 and the second electrostatic chuck 12.

In some embodiments, as shown in FIG. 13, the bonding method may further include making temperatures of the first substrate SUB1, the second substrate SUB2, the chamber 10, the first electrostatic chuck 11 configured to hold the first substrate SUB1 and the second electrostatic chuck 12 configured to hold the second substrate SUB2 consistent before sending the first substrate SUB1 and the second substrate SUB2 into the chamber 10. For example, the bonding system may include two temperature control plates 16. The controller 17 can control the robotic arm (not shown) to transport the first substrate SUB1 onto one of the temperature control plates 16 and to transport the second substrate SUB2 onto the other one of the temperature control plates 16 to control the temperatures of the first substrate SUB1 and the second substrate SUB2 via the temperature control plates 16 before sending the first substrate SUB1 and the second substrate SUB2 into the chamber 10. In addition, the controller 17 can control the temperatures of the temperature control plates 16, the chamber 10, the first electrostatic chuck 11 and the second electrostatic chuck 12 so that the temperatures of the first substrate SUB1, the second substrate SUB2 are consistent with the temperatures of the chamber 10, the first electrostatic chuck 11 and the second electrostatic chuck 12.

In some embodiments, as shown in FIG. 14 and FIG. 15, the bonding method may further include performing topography adjustment on the first substrate SUB1 and the second substrate SUB2 before bonding the first substrate SUB1 and the second substrate SUB2 for fine adjustment of irregular (or non-linear) offset compensation.

As shown in FIG. 14 and FIG. 15, each of the first electrostatic chuck 11 and the second electrostatic chuck 12 may include a pin array PA configured to change substrate topography. The pin array PA may include a plurality of pins PN arranged in the direction X and the direction Y, but the present disclosure is not limited thereto. The arrangement of the pins PN may be changed according to needs. In some embodiments, as shown in FIG. 15, each of the first electrostatic chuck 11 and the second electrostatic chuck 12 may further include a plurality of motors (e.g., piezo motors) M respectively connected to the plurality of pins PN to control the lengths of the plurality of pins PN between the substrate and the plurality of motors M, and thereby controlling the substrate topography or reducing the offsets induced by substrate warpage.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the present disclosure, a bonding system includes a chamber, a first electrostatic chuck, a second electrostatic chuck, a visible light sensor module and a nonvisible light module. The chamber is configured to provide a vacuum state. The first electrostatic chuck is configured to hold a first substrate having a first alignment mark in the chamber, wherein the first electrostatic chuck has a first window overlapped with the first alignment mark. The second electrostatic chuck is configured to hold a second substrate having a second alignment mark in the chamber such that the second substrate faces the first substrate, wherein the second electrostatic chuck has a second window overlapped with the second alignment mark. The visible light sensor module is configured to capture images of the first alignment mark and the second alignment mark in the chamber. The nonvisible light module is configured to capture a combined image of the first alignment mark and the second alignment mark via the first window and the second window overlapping each other in the vacuum state. In some embodiments, the nonvisible light module is an infrared light module including an infrared light emitter that emits infrared light and an infrared light receiver that receives the infrared light, and wherein the first window and the second window allow the infrared light to pass through. In some embodiments, each of the first electrostatic chuck and the second electrostatic chuck includes a ceramic layer, a cooling plate and a temperature control structure located between the ceramic layer and the cooling plate. In some embodiments, the temperature control structure includes a patterned electric heating layer, and the patterned electric heating layer includes a checkerboard pattern, a concentric pattern, a radial pattern, or a combination of the above. In some embodiments, each of the first electrostatic chuck and the second electrostatic chuck includes a pin array configured to change substrate topography.

In accordance with some embodiments of the present disclosure, a bonding method includes: holding a first substrate in a chamber; holding a second substrate in the chamber with the second substrate facing the first substrate; performing a first alignment process on the first substrate and the second substrate; performing a second alignment process on the first substrate and the second substrate after performing the first alignment process; vacuuming the chamber; and bonding the first substrate and the second substrate after vacuuming the chamber. In some embodiments, performing the first alignment process includes: capturing images of a first alignment mark of the first substrate and a second alignment mark of the second substrate via a visible light sensor module to determine positions of the first alignment mark and the second alignment mark; and performing a first compensation movement. In some embodiments, the visible light sensor module is positioned between the first substrate and the second substrate when capturing the images of the first alignment mark and the second alignment mark, and the visible light sensor module is moved away from the first substrate and the second substrate before performing the first compensation movement. In some embodiments, the bonding method further includes: reducing a distance between the first substrate and the second substrate before performing the second alignment process. In some embodiments, the distance between the first substrate and the second substrate when performing the second alignment process is 0 µm to 5 µm. In some embodiments, performing the second alignment process includes: capturing a combined image of a first alignment mark of the first substrate and a second alignment mark of the second substrate via a nonvisible light module to determine an offset between centers of the first alignment mark and the second alignment mark; and performing a second compensation movement. In some embodiments, the first substrate is held by a first electrostatic chuck having a first window that allows nonvisible light to pass through, the second substrate is held by a second electrostatic chuck having a second window that allows nonvisible light to pass through, and the nonvisible light module captures the combined image via the first window and the second window from a side of the first electrostatic chuck away from the first substrate, a side of the second electrostatic chuck away from the second substrate, or a combination of the above. In some embodiments, the bonding method further includes: performing local temperature control on at least one of the first substrate and the second substrate before bonding the first substrate and the second substrate. In some embodiments, the bonding method further includes: making temperatures of the first substrate, the second substrate, the chamber, a first electrostatic chuck configured to hold the first substrate and a second electrostatic chuck configured to hold the second substrate consistent before sending the first substrate and the second substrate into the chamber. In some embodiments, the bonding method further includes: performing topography adjustment on the first substrate and the second substrate before bonding the first substrate and the second substrate.

In accordance with alternative embodiments of the present disclosure, a bonding method includes: holding a first substrate in a chamber; holding a second substrate in the chamber with the second substrate facing the first substrate; performing a first alignment process on the first substrate and the second substrate via a visible light sensor module;

reducing a distance between the first substrate and the second substrate; performing a second alignment process on the first substrate and the second substrate via a nonvisible light module after reducing the distance between the first substrate and the second substrate; vacuuming the chamber; and bonding the first substrate and the second substrate after vacuuming the chamber. In some embodiments, performing the first alignment process includes: capturing images of a first alignment mark of the first substrate and a second alignment mark of the second substrate to determine positions of the first alignment mark and the second alignment mark; and performing a first compensation movement, and wherein: the visible light sensor module is positioned between the first substrate and the second substrate when capturing the images of the first alignment mark and the second alignment mark, and the visible light sensor module is moved away from the first substrate and the second substrate before performing the first compensation movement. In some embodiments, moving the visible light sensor module away from the first substrate and the second substrate includes moving the visible light sensor module out of the chamber, the chamber is vacuumed after the visible light sensor is moved out of the chamber, and performing the first compensation movement and reducing the distance between the first substrate and the second substrate are after vacuuming the chamber. In some embodiments, the distance between the first substrate and the second substrate when performing the second alignment process is 0 µm to 5 µm. In some embodiments, performing the second alignment process includes: capturing a combined image of a first alignment mark of the first substrate and a second alignment mark of the second substrate to determine an offset between centers of the first alignment mark and the second alignment mark; and performing a second compensation movement, and wherein: the first substrate is held by a first electrostatic chuck having a first window that allows nonvisible light to pass through, the second substrate is held by a second electrostatic chuck having a second window that allows nonvisible light to pass through, and the nonvisible light module captures the combined image via the first window and the second window from a side of the first electrostatic chuck away from the first substrate, a side of the second electrostatic chuck away from the second substrate, or a combination of the above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonding system, comprising:
   a chamber configured to provide a vacuum state;
   a first electrostatic chuck configured to hold a first substrate having a first alignment mark in the chamber, wherein the first electrostatic chuck has a first window overlapped with the first alignment mark;
   a second electrostatic chuck configured to hold a second substrate having a second alignment mark in the chamber such that the second substrate faces the first substrate, wherein the second electrostatic chuck has a second window overlapped with the second alignment mark;
   a visible light sensor module configured to capture images of the first alignment mark and the second alignment mark in the chamber; and
   a nonvisible light module configured to capture a combined image of the first alignment mark and the second alignment mark via the first window and the second window overlapping each other in the vacuum state, and
   wherein the visible light sensor module is disposed at a first position between the first substrate and the second substrate in a first alignment process to capture the images of the first alignment mark and the second alignment mark in the chamber, and the visible light sensor module is disposed at a second position that is on a side of the first substrate and the second substrate in a second alignment process.

2. The bonding system according to claim 1, wherein the nonvisible light module is an infrared light module comprising an infrared light emitter that emits infrared light and an infrared light receiver that receives the infrared light, and wherein the first window and the second window allow the infrared light to pass through.

3. The bonding system according to claim 1, wherein each of the first electrostatic chuck and the second electrostatic chuck comprises a ceramic layer, a cooling plate and a temperature control structure located between the ceramic layer and the cooling plate.

4. The bonding system according to claim 3, wherein the temperature control structure comprises a patterned electric heating layer, and the patterned electric heating layer comprises a checkerboard pattern, a concentric pattern, a radial pattern, or a combination of the above.

5. The bonding system according to claim 1, wherein each of the first electrostatic chuck and the second electrostatic chuck comprises a pin array configured to change substrate topography.

6. A bonding method, comprising:
   holding a first substrate in a chamber;
   holding a second substrate in the chamber with the second substrate facing the first substrate;
   performing a first alignment process on the first substrate and the second substrate via a visible light sensor module;
   performing a second alignment process on the first substrate and the second substrate via a nonvisible light module after performing the first alignment process;
   vacuuming the chamber; and
   bonding the first substrate and the second substrate after vacuuming the chamber, wherein the second alignment process is performed prior to the first substrate being in contact with the second substrate.

7. The bonding method according to claim 6, wherein performing the first alignment process comprises:
   capturing images of a first alignment mark of the first substrate and a second alignment mark of the second substrate via the visible light sensor module to determine positions of the first alignment mark and the second alignment mark; and
   performing a first compensation movement.

8. The bonding method according to claim 7, wherein:
   the visible light sensor module is disposed at a first position between the first substrate and the second substrate when capturing the images of the first alignment mark and the second alignment mark, and the visible light sensor module is disposed at a second position that is on a side of the first substrate and the second substrate before performing the first compensation movement.

9. The bonding method according to claim 6, further comprising:
reducing a distance between the first substrate and the second substrate before performing the second alignment process.

10. The bonding method according to claim 9, wherein the distance between the first substrate and the second substrate when performing the second alignment process is 0 μm to 5 μm.

11. The bonding method according to claim 6, wherein performing the second alignment process comprises:
capturing a combined image of a first alignment mark of the first substrate and a second alignment mark of the second substrate via the nonvisible light module to determine an offset between centers of the first alignment mark and the second alignment mark; and
performing a second compensation movement.

12. The bonding method according to claim 11, wherein:
the first substrate is held by a first electrostatic chuck having a first window that allows nonvisible light to pass through,
the second substrate is held by a second electrostatic chuck having a second window that allows nonvisible light to pass through, and
the nonvisible light module captures the combined image via the first window and the second window from a side of the first electrostatic chuck away from the first substrate, a side of the second electrostatic chuck away from the second substrate, or a combination of the above.

13. The bonding method according to claim 6, further comprising:
performing local temperature control on at least one of the first substrate and the second substrate before bonding the first substrate and the second substrate.

14. The bonding method according to claim 6, further comprising:
making temperatures of the first substrate, the second substrate, the chamber, a first electrostatic chuck configured to hold the first substrate and a second electrostatic chuck configured to hold the second substrate consistent before sending the first substrate and the second substrate into the chamber.

15. The bonding method according to claim 6, further comprising:
performing topography adjustment on the first substrate and the second substrate before bonding the first substrate and the second substrate.

16. A bonding method, comprising:
holding a first substrate in a chamber;
holding a second substrate in the chamber with the second substrate facing the first substrate;
disposing a visible light sensor module at a first position between the first substrate and the second substrate;
performing a first alignment process on the first substrate and the second substrate via the visible light sensor module after disposing the visible light sensor module at the first position;
after performing the first alignment process, disposing the visible light sensor module at a second position that is on a side of the first substrate and the second substrate and reducing a distance between the first substrate and the second substrate;
performing a second alignment process on the first substrate and the second substrate via a nonvisible light module after reducing the distance between the first substrate and the second substrate;
vacuuming the chamber; and
bonding the first substrate and the second substrate after vacuuming the chamber.

17. The bonding method according to claim 16, wherein performing the first alignment process comprises:
capturing images of the first alignment mark of the first substrate and the second alignment mark of the second substrate to determine positions of the first alignment mark and the second alignment mark; and
performing a first compensation movement, and wherein:
the visible light sensor module is disposed at the second position before performing the first compensation movement.

18. The bonding method according to claim 17, wherein:
disposing the visible light sensor module at the second position comprises moving the visible light sensor module out of the chamber,
the chamber is vacuumed after the visible light sensor is moved out of the chamber, and
performing the first compensation movement and reducing the distance between the first substrate and the second substrate are after vacuuming the chamber.

19. The bonding method according to claim 16, wherein the distance between the first substrate and the second substrate when performing the second alignment process is 0 μm to 5 μm.

20. The bonding method according to claim 16, wherein performing the second alignment process comprises:
capturing a combined image of the first alignment mark of the first substrate and the second alignment mark of the second substrate to determine an offset between centers of the first alignment mark and the second alignment mark; and
performing a second compensation movement, and wherein:
the first substrate is held by a first electrostatic chuck having a first window that allows nonvisible light to pass through,
the second substrate is held by a second electrostatic chuck having a second window that allows nonvisible light to pass through, and
the nonvisible light module captures the combined image via the first window and the second window from a side of the first electrostatic chuck away from the first substrate, a side of the second electrostatic chuck away from the second substrate, or a combination of the above.

* * * * *